(12) United States Patent
Gandolfo

(10) Patent No.: US 11,894,475 B2
(45) Date of Patent: Feb. 6, 2024

(54) SILICON-BASED SPIN-QUBIT QUANTUM MAGNETOMETER AND RADAR SYSTEM WITH ALL ELECTRICAL CONTROL

(71) Applicant: Pierre Gandolfo, Le Cannet (FR)

(72) Inventor: Pierre Gandolfo, Le Cannet (FR)

( * ) Notice: Subject to any disclaimer, the term of this patent is extended or adjusted under 35 U.S.C. 154(b) by 535 days.

(21) Appl. No.: 17/167,318

(22) Filed: Feb. 4, 2021

(65) Prior Publication Data
US 2022/0190174 A1   Jun. 16, 2022

Related U.S. Application Data

(60) Provisional application No. 63/124,203, filed on Dec. 11, 2020.

(51) Int. Cl.
| | |
|---|---|
| G01R 33/06 | (2006.01) |
| H01L 31/0352 | (2006.01) |
| G01S 13/02 | (2006.01) |
| G06N 10/00 | (2022.01) |
| G01S 7/03 | (2006.01) |

(52) U.S. Cl.
CPC .... *H01L 31/035218* (2013.01); *G01R 33/066* (2013.01); *G01S 7/032* (2013.01); *G01S 13/02* (2013.01); *G06N 10/00* (2019.01)

(58) Field of Classification Search
CPC .. G01R 33/066; G01R 33/00; G01R 33/0035; G01R 33/0023; G01R 33/0017; G01R 31/3191; G06N 10/00; G01B 7/004; G01C 17/38; G06F 3/017; G06F 3/0346; G06F 3/012; G01S 13/02; G01S 7/032; H01L 31/035218
See application file for complete search history.

(56) References Cited

U.S. PATENT DOCUMENTS

2016/0300155 A1* 10/2016 Betz ............... G06N 10/00
2019/0392352 A1* 12/2019 Lampert ........... G06F 1/206

* cited by examiner

*Primary Examiner* — Jermele M Hollington
*Assistant Examiner* — Taqi R Nasir

(57) ABSTRACT

Embodiments of the present disclosure provide a spin-qubit quantum magnetometer and radar apparatus, entirely implemented in silicon and with full electrical control. By default, each detection element of the silicon-based spin-qubit quantum magnetometer and radar apparatus with full electrical control of the invention is built around a Field Effect Transistor (FET) on silicon over insulator with a back-gate as well as two front gates, which can be adjacent to one another along the Drain-Source FET channel or alternatively placed across that same channel and facing each other as corner gates.

12 Claims, 3 Drawing Sheets

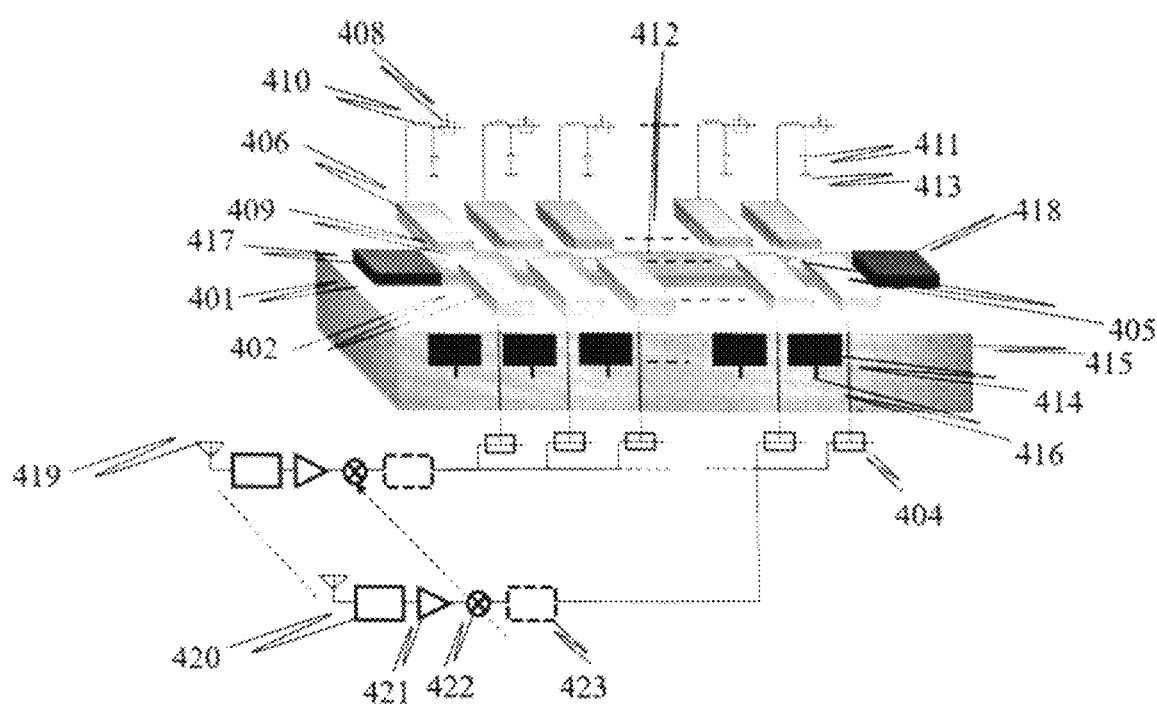
FIG. 4b (Front Page View)

SILICON-BASED SPIN-QUBIT QUANTUM MAGNETOMETER AND RADAR SYSTEM WITH ALL ELECTRICAL CONTROL

CROSS-REFERENCE TO RELATED APPLICATIONS

The present document claims the benefits (i.e. provisional application for patent) of the earlier filing date of U.S. patent application Ser. No. 63/124,203 (confirmation number 1027, EPS ID 41359768) filled on Dec. 11, 2020, and entitled "Silicon-based spin-qubit magnetometer and radar system with all electrical control", the contents of which are incorporated by reference.

STATEMENT REGARDING FEDERALLY SPONSORED RESEARCH OR DEVELOPMENT

Non-applicable

REFERENCE TO SEQUENCE LISTING, A TABLE, OR A COMPUTER PROGRAM LISTING COMPACT DISC APPENDIX

Non-applicable.

FIELD OF THE INVENTION

The present invention relates to extremely-sensitive quantum magnetometer and radar apparatus for precise radar targets detections as well as mineral/mining prospecting, discovery of distant astronomical objects, mine and metal detectors, tomography/MRI (Magnetic Resonance Imaging).

BACKGROUND OF THE INVENTION

The present invention relates to radar (RAdio Detection And Ranging) systems that use electromagnetic waves to detect the presence, position and speed of a target (inc. object, people and beyond) as well as to magnetometers that measures magnetic fields more generally.

In a radar system, the waves sent by the transmitter are reflected by the target(s), and the return signals (called radar echoes) are picked up and analyzed by the receiver, often located in the same beat ion as the transmitter. Distance is calculated through round-trip delay of the signal, the azimuthal/elevation angular position is calculated through the antenna elements phase shift and spatial frequency, and the speed is calculated from the Doppler frequency shift, thus providing a complete 4-Dimension target detection (3D space+time).

As illustrated by FIG. 1, a quantum radar (101), also known as quantum illumination, is a new form of extremely-sensitive radar, this extreme sensitivity is presently achieved through entangled biphoton state (Quantum Entanglement), which is done by the Entangled Photons Source block (102). The Signal portion of the entangled biphoton state (110) is first converted from an optical waveform into an electromagnetic waveform by art Electro-Opto-Mechanical converter (103), before being sent to the target (106) through a transmit/receive switch (104) and an antenna (105). The returned target-reflected signal (112) is first converted from an electro-magnetic waveform into an optical waveform by an Electro-Opto-Mechanical converter (107) before being correlated (108) with the locally-retained Idler signal (111) and processed (109). The Quantum Entanglement allows to maintain an extremely strong Signal-Idler correlation, which then boosts the detection efficiency of weakly-reflecting targets in environments with low signal power and strong background noise.

The problem though with current quantum illumination solutions is that they suffer from multiple drawbacks. They are first optical-based solution in order to generate the quantum entanglement which makes them complex to implement. They also lack scalability (vs. silicon-based solution) for mass-market deployment and more importantly their application space is very much limited. Unlike classical radars which can interrogate many potential targets over multiple ranging bins, velocities and angle of arrival, current quantum illumination solutions can only be used for basic target presence detection (meaning presence or not for a single azimuth, elevation, range hypothesis at a time) and as such do not fit the above definition of a radar system.

The hereby-proposed silicon-based spin-qubit quantum radar system with all-electrical control proposes to remove all the aforementioned limitations by enabling a complete and extremely-sensitive 4-Dimension target detection (3D space+time) with full electrical-control and that so entirely implemented in silicon for mass scalability.

BRIEF SUMMARY OF THE INVENTION

Consistent with the title of this section, only a brief description of elected features of the present invention is the presented. A more complete description of the present invention is the subject of this entire document.

The silicon-based spin-qubit quantum magnetometer and radar system with all-electrical control according to the invention enable to suppress all aforementioned drawbacks.

A feature of the silicon-based spin-qubit quantum magnetometer and radar system with all-electrical control according to the invention is that each magnetometer sensing element (aka range bio magnetometer) is built around a FET (Field Effect Transistor) on silicon over insulator with a Back-Gate (BG) as well as two Front Gates (FG), respectively called Manipulation (M) and Read-out (R) gate, which can be adjacent to one another along the Drain-Source (DS) FET channel or alternatively placed across that same channel and facing each other as corner gates.

Another feature of the silicon-based spin-qubit quantum magnetometer and radar system with all-electrical control according to the invention is that the target-reflected microwave (MW) frequency for a given range bin will induce a spin qubit rotation of the underlying Quantum Dot (QD) sitting underneath the Manipulation (M) gate at a Rabi frequency proportional to the magnitude of the returned echo signal. Magnitude of the returned echo signal being then retrieved either via Drain-Source (DS) current measurement or via RF (Radio Frequency) gate reflectometry through the Quantum Dot sitting underneath the Read-out (R) gate.

Another feature of the silicon-based spin-qubit quantum magnetometer and radar system with all-electrical control according to the invention is that it can be scaled over multiple range bins by for instance implementing a series of face-to-face corner Front-Gates (FG) in parallel along a Drain-Source (DS) FET channel and having those face-to-face corner Front-Gates (FG) connected to the same or different antenna elements via filters, amplifiers and optional mixers. Such configuration allowing then the calculation of distance with very fine resolution over fast time, of speed through Doppler phase changes over slow time, and of azimuthal/elevation arrival angle through antenna phase shift and spatial frequency.

Another feature of the silicon-based spin-qubit quantum magnetometer and radar system with all-electrical control according to the invention is that the Back-Gates (BG) are used not only to control coupling between the two Quantum Dots (QD) sitting respectively underneath the Manipulation (M) and Read-out (R) gates of a given magnetometer sensing element (aka range bin magnetometer), but also to reduce the heat dissipation of the surrounding control electronics, for cryo-CMOS (Complementary Metal Oxide Semiconductor) operation, through the adjustment of FET threshold voltage and subthreshold slope.

In other embodiments of the present invention, the silicon based spin-qubit quantum magnetometer and radar system according to the invention may further be used as a simple magnetometer for the measurement of both static and dynamic magnetic field/flux.

As such, the silicon-based spin-qubit quantum magnetometer and radar system according to the invention is particularly well-suited for any type of extremely-sensitive radar applications but also mineral/mining prospecting, discovery of distant astronomical objects, mine and metal detectors, tomography/MRI (Magnetic Resonance Imaging).

BRIEF DESCRIPTION OF THE SEVERAL VIEWS OF THE DRAWING

A more complete appreciation of the present invention and many of the attendant advantages thereof will be readily obtained as the same becomes better understood by reference to the following detailed description when considered in connection with the accompanying drawings. In these drawings like reference numerals designate identical or corresponding parts throughout the several views.

FIG. 4b illustrates, in a three-dimensional space, another embodiment of the silicon-based spin-qubit quantum magnetometer and radar system according to the invention with multiple range bins implemented through a series of face-to-face corner gates being placed in parallel along a Drain-Source channel and having those face-to-face corner gates connected to different antenna elements via separate filters, amplifiers and optional mixers.

DETAILED DESCRIPTION OF THE INVENTION

Figure 1:
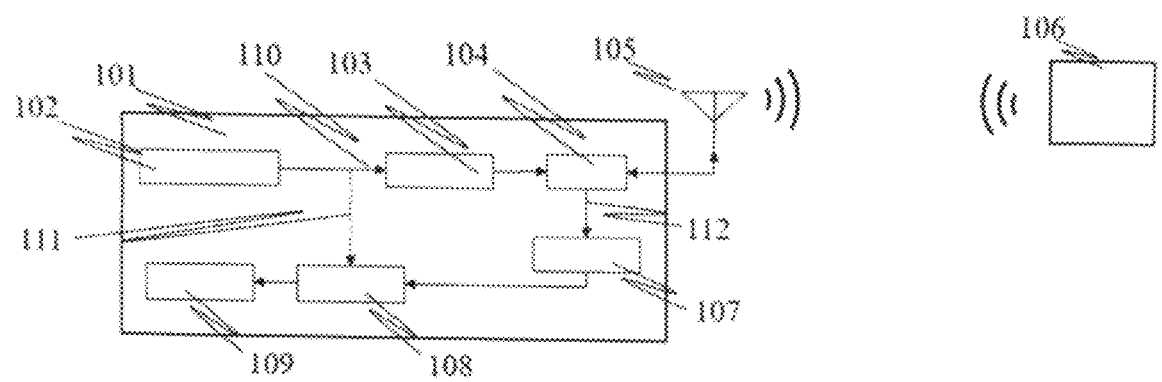
FIG. 1 shows a quantum illumination/radar from prior art with entangled photons source.
Figure 2:
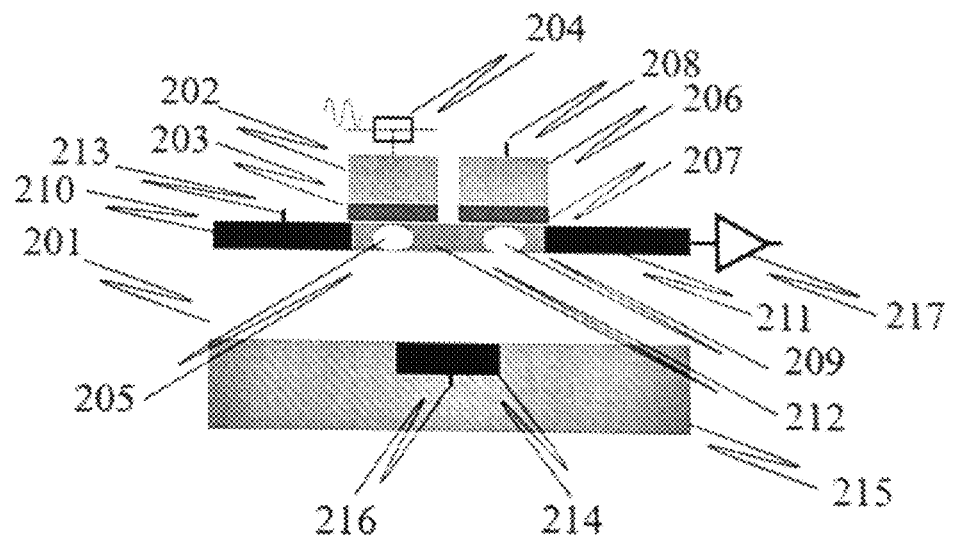
FIG. 2 cross-section view along the FET transistor gate length shows an embodiment of the silicon-based spin-qubit quantum magnetometer and radar system according to the invention with the two from-gates, Manipulation (M) and Read-out (R) gate, adjacent to one another along the Drain-Source (DS) FET channel.

Referring to those drawings and more specifically to FIG. 2, each magnetometer sensing element (aka range bin magnetometer), in a preferred embodiment of the present invention, is built around a FET (Field Effect Transistor) on silicon (212) over insulator (201) over silicon (215) with a back-gate (214) as well as two front-gates, respectively called Manipulation gate (202) over silicon oxide (203) and Read-out (206) gate over silicon oxide (207), which are adjacent to one another along the silicon Drain (211)-Source (210) FET channel (212).

After initialization of both front-gates into their quantum ground states, the Manipulation gate (202) of a given range bin first gets activated and biased via one input of the bias tree pin (204) before applying to that same gate the target-reflected microwave frequency over a fixed time duration via the other input of the bias tree pin (204). This microwave frequency will then induce a spin qubit rotation of the underlying Quantum Dot (205), that can be either electron or proton, between the Zeeman states at a Rabi frequency proportional to the magnitude of the returned echo signal in that given time period.

At the end of a given range bin activation time, the corresponding Manipulation gate (202) gets disabled and the resulting spin rotation gets read via the second Quantum Dot (209) sitting underneath the Read-out gate (206). The coupling between Manipulation Quantum Dot (205) and Read-out Quantum Dot (209) being controlled via the Back-Gate (214) biasing input (216). Magnitude of the returned echo signal for that given range bin being then retrieved via Drain (211)-Source (210) current measurement (spin-to-charge conversion through Coulomb blockade and Spin Blockade effects) via a current-voltage converter (217).

Figure 3:
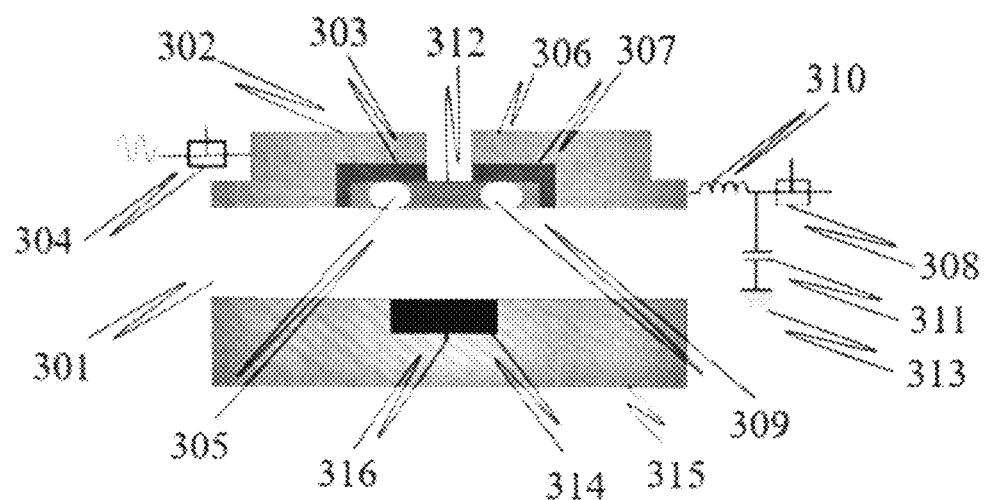
FIG. 3 cross-section view along the FET transistor gate width illustrates another embodiment of the silicon-based spin-qubit quantum magnetometer and radar system according to the invention with the two front-gates, Manipulation (M) and Read-out (R) gate, placed across the Drain-Source (DS) FET channel and facing each other as corner gates.

In another preferred embodiment of the present invention shown in FIG. 3, each magnetometer sensing element (aka range bin magnetometer) is built around a FET (Field Effect Transistor) on silicon (312) over insulator (301) over silicon (315) with a back-gate (314) as well as two front-gates, respectively called Manipulation gate (302) over silicon oxide (303) and Read-out (306) gate over silicon oxide (307), which are placed across the silicon Drain-Source FET channel (312) and facing each other as corner gates.

After initialization of both front into their quantum ground suites, the Manipulation gate (302) of a given range bin first gets activated and biased via one input of the bias tree pin (304) before applying to that same gate the target-reflected microwave frequency over a fixed time duration via the other input of the bias tree pin (304). This microwave frequency will then induce a spin qubit rotation of the underlying Quantum Dot (305), that can be either electron or proton, between the Zeeman states at a Rabi frequency proportional to the magnitude of the returned echo signal in that given time period.

At the end of a given range bin activation time, the corresponding Manipulation gate (302) gets disabled and the resulting spin rotation gets read via the second Quantum Dot (309) sitting underneath the Read-out gate (306). The coupling between Manipulation Quantum Dot (305) and Read-out Quantum Dot (309) being controlled via the Back-Gate (314) biasing input (316). Magnitude of the returned echo signal for that given range bin being then retrieved via RF (Radio Frequency) gate reflectometry, meaning shift in the resonance frequency of the attached LC resonator made of inductance (310), capacitor (311), input/output signal tree (308) and connected on the other end to ground (313).

Figure 4A:
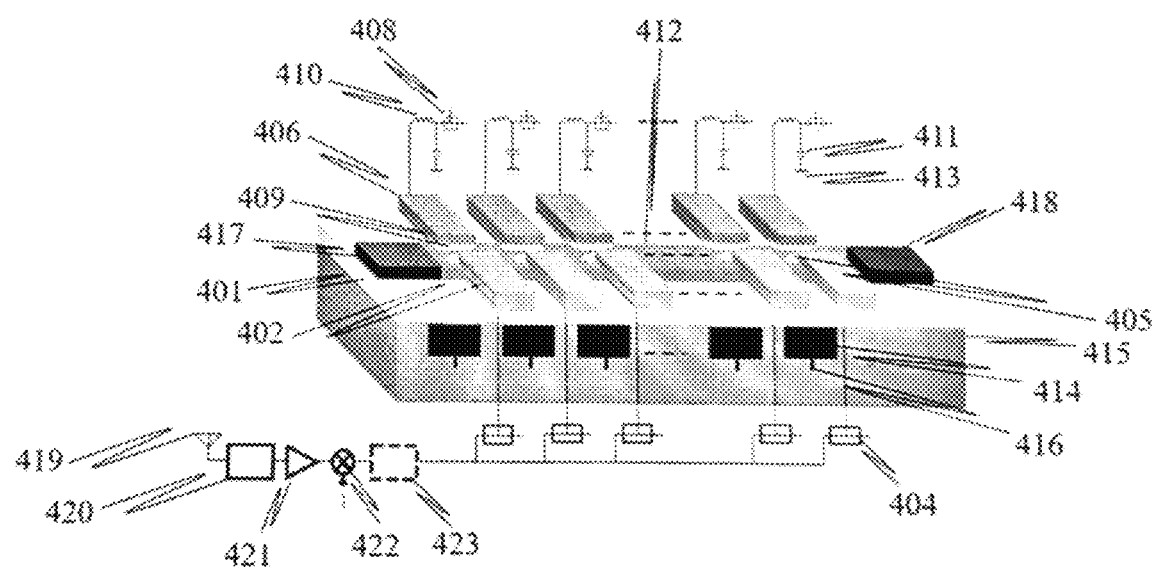
FIG. 4a shows, in a three-dimensional space, another embodiment of the silicon-based spin-qubit quantum magnetometer and radar system according to the invention with multiple range bins implemented through a series of face-to-face corner gates being placed in parallel along a Drain-Source channel and having those face-to-face corner gates connected to the same antenna via filters, amplifiers and optional mixer.

In the embodiment of the present invention shown in FIG. 4a, the above approach with face-to-face corner front gates for each magnetometer sensing element (aka range bin magnetometer) on silicon (412) over insulator (401) over silicon (415), gets scaled over multiple range bins by implementing a series of face-to-face corner gates in parallel along a silicon Drain (418)-Source (417) channel (412) and having the series of corner Manipulation gates (402), with their associated underlying Quantum Dots (405), connected to the same antenna (419) via one (420) or additional optional filters (423), amplifier (421) and optional mixer (422) with local oscillator. The series of corner Read-out gates (406), with their associated underlying Quantum Dots (409), being on their end each connected to separate LC resonators, each made of inductance (410), capacitor (411), input/output signal tree (408) and connected on the other end to ground (413). The coupling between each Manipulation Quantum Dot (405) and Read-out Quantum Dot (409) being here again controlled via their respective Back-Gate (414) biasing input (416). Such configuration allowing then the calculation of distance with very fine resolution over fast time and calculation of speed through Doppler phase changes over slow time.

In the embodiment of the present invention illustrated in FIG. 4b, the above approach with face-to-face corner front gates for each magnetometer sensing element (aka range bin magnetometer) on silicon (412) over insulator (401) over silicon (415), gets scaled over multiple range bins by implementing a series of face-to-face corner gates in parallel along a silicon Drain (418)-Source (417) channel (412) and having the series of corner Manipulation gates (402), with their associated underlying Quantum Dots (405), connected to multiple antenna elements (419) via a series of one (420) or additional optional filters (425), amplifiers (421) and optional mixers (422) with local oscillator. The series of corner Read-out gates (406), with their associated underlying Quantum Dots (409), being on their end each connected to separate LC resonators, each made of inductance (410), capacitor (411), input/output signal tree (408) and connected on the other end to ground (413). The coupling between each Manipulation Quantum Dot (405) and Read-out Quantum Dot (409) being here again controlled via their respective Back-Gate (414) biasing input (416). Such configuration allowing then the calculation of distance with very fuse resolution over fast time, calculation of speed through Doppler phase changes over slow time, and calculation of azimuthal/elevation arrival angle through antenna phase shift and spatial frequency. This then leads to a complete 4-Dimension target detection with high precision and all electrically-controlled.

While not illustrated, it should further be noted that the back gates can not only be used to control coupling between the two quantum dots of a given range bin, as previously described and illustrated, but also to reduce the heat dissipation of the surrounding control electronics, for cryo-CMOS (Complementary Metal Oxide Semiconductor) operation, through the adjustment of FET threshold voltage and subthreshold slope.

Finally, and although the magnetometer sensing element illustrated in FIG. 2 and FIG. 3 is used as building element of a spin-qubit quantum radar system (e.g. range bin magnetometer), alternate embodiments may use it for other type of sensing applications. For instance, and according to non-illustrated embodiments of the present invention, the magnetometer sensing element illustrated in FIG. 2 and FIG. 3 could be used for the measurement of both static and dynamic magnetic field/flux through respectively a Ramsey or spin-echo sequence. As such, numerous modifications and variations of the present invention are possible in light of the above teachings. It is therefore to be understood that within the scope of the appended claims, the invention may be practiced otherwise than as specifically described herein.

The invention claimed is:

1. A spin-qubit quantum magnetometer sensing device built around a field-effect transistor on silicon over insulator with all-electrical control through a back-gate and two front-gates.

2. The spin-qubit quantum magnetometer sensing device, as recited in claim 1, where the first front-gate is adjacent to the second front-gate along drain-source channel of the field-effect transistor and where the back-gate is used to control coupling between first and second front-gates through biasing.

3. The spin-qubit quantum magnetometer sensing device, as recited in claim 1, where the first corner front-gate is facing the second corner front-gate across drain-source channel of the field-effect transistor and where the back-gate is used to control coupling between first and second front-gates through biasing.

4. The spin-qubit quantum magnetometer sensing device, as recited in claim 2, where a magnetic field gets sensed via the biased first front gate through spin qubit manipulation of an underlying quantum dot.

5. The spin-qubit quantum magnetometer sensing device, as recited in claim 3, where a magnetic field gets sensed via the biased first front-gate through spin qubit manipulation of an underlying quantum dot.

6. The spin-qubit quantum magnetometer sensing device, as recited in claim 4, where the biased second front-gate is used for read-out of resulting spin qubit manipulation experienced by the first front-gate quantum dot via a second quantum dot sitting underneath the second front-gate through spin-to charge conversion.

7. The spin-qubit quantum magnetometer sensing device, as recited in claim 5, where the biased second front-gate is used for read-out of the resulting spin qubit manipulation experienced by the first front-gate quantum dot via a second quantum dot sitting underneath the second front-gate through spin-to charge conversion.

8. The spin-qubit quantum magnetometer sensing device, as recited in claim 4, where the biased second front-gate is used for read-out of the resulting spin qubit manipulation experienced by the first front-gate quantum dot via a second quantum dot sifting underneath the second front-gate through radio frequency gate reflectometry.

9. The spin-qubit quantum magnetometer sensing device, as recited in claim 5, where the biased second front-gate is used for read-out of the resulting spin qubit manipulation experienced by the first from-gate quantum dot via a second quantum dot sitting underneath the second front-gate through radio frequency gate reflectometry.

10. Multiple spin-qubit quantum magnetometer sensing devices, as recited in claim 3, placed in parallel to one another along drain-source channel of a field-effect transistor, and all connected to an antenna via a filter, an amplifier and a mixer, in order to form range bins of a spin-qubit quantum radar system for both targets range and speed calculation.

11. The spin-qubit quantum radar system, as recited in claim 10, where the spin-qubit quantum magnetometer sensing devices are connected to different set of antenna elements, amplifiers and mixers in order to further retrieve azimuthal and elevation angles of arrival of radar-echoes trough spatial phase shifting.

12. The quantum magnetometer sensing device, as recited in claim 1, where the back-gate is further used to reduce passive power contribution to heat dissipation of surrounding control electronics through adjustment of field-effect transistors threshold voltage and subthreshold slope.

\* \* \* \* \*